United States Patent
Yang et al.

(10) Patent No.: US 9,537,007 B2
(45) Date of Patent: Jan. 3, 2017

(54) FINFET WITH CUT GATE STRESSOR

(71) Applicant: QUALCOMM Incorporated, San Diego, CA (US)

(72) Inventors: Haining Yang, San Diego, CA (US); Yanxiang Liu, Glenville, NY (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/680,711

(22) Filed: Apr. 7, 2015

(65) Prior Publication Data

US 2016/0300948 A1 Oct. 13, 2016

(51) Int. Cl.
 *H01L 21/70* (2006.01)
 *H01L 29/78* (2006.01)
 *H01L 27/088* (2006.01)
 *H01L 29/423* (2006.01)
 *H01L 21/8234* (2006.01)
 *H01L 29/10* (2006.01)
 *H01L 29/66* (2006.01)

(52) U.S. Cl.
 CPC ... *H01L 29/7845* (2013.01); *H01L 21/823431* (2013.01); *H01L 21/823437* (2013.01); *H01L 27/0886* (2013.01); *H01L 29/1037* (2013.01); *H01L 29/4232* (2013.01); *H01L 29/66545* (2013.01)

(58) Field of Classification Search
 CPC .......... H01L 29/7845; H01L 29/66545; H01L 27/0886; H01L 29/4232; H01L 21/823431; H01L 21/823437; H01L 29/1037; H01L 21/845; H01L 29/41791; H01L 29/66795; H01L 27/0924; H01L 27/10826

USPC ........ 257/288, 368, 369, 220; 438/151, 197, 438/199, 51, 156, 173, 192

See application file for complete search history.

(56) References Cited

U.S. PATENT DOCUMENTS

| | | |
|---|---|---|
| 8,739,104 B1 | 5/2014 | Penzes et al. |
| 8,872,284 B2 | 10/2014 | Kelly et al. |
| 8,889,500 B1 | 11/2014 | Kamineni et al. |
| 2007/0190708 A1 | 8/2007 | Kaneko et al. |
| 2009/0045466 A1 | 2/2009 | Nakamura |
| 2009/0101982 A1 | 4/2009 | Nagatomo |
| 2009/0152623 A1 | 6/2009 | Goto et al. |

(Continued)

OTHER PUBLICATIONS

International Search Report and Written Opinion—PCT/US2016/026195—ISA/EPO—Jul. 4, 2016.

*Primary Examiner* — Jarrett Stark
*Assistant Examiner* — Shahed Ahmed
(74) *Attorney, Agent, or Firm* — Muncy, Geissler, Olds & Lowe, P.C.

(57) ABSTRACT

A semiconductor fin includes a channel region. A gate-stressor member, formed of a metal, extends transverse to the fin and includes gate surfaces that straddle the fin in the channel region. The gate-stressor member has a configuration that includes a partial cut spaced from the fin by a cut distance. The configuration causes, through the gate surfaces, a transverse stress in the fin, having a magnitude that corresponds to the cut distance. Transverse stressor members, formed of a metal, straddle the fin at regions outside of the channel region and cause, at the regions outside of the channel region, additional transverse stresses in the fin. The magnitude that corresponds to the cut distance, in combination with the additional transverse stresses, induces a longitudinal compressive strain in the channel region.

19 Claims, 8 Drawing Sheets

(56) References Cited

U.S. PATENT DOCUMENTS

| | | |
|---|---|---|
| 2013/0026572 A1 | 1/2013 | Kawa et al. |
| 2013/0092984 A1 | 4/2013 | Liu et al. |
| 2013/0277760 A1 | 10/2013 | Lu et al. |
| 2013/0285143 A1 | 10/2013 | Oh et al. |
| 2013/0292777 A1 | 11/2013 | Liaw |
| 2013/0307088 A1 | 11/2013 | Yang et al. |
| 2014/0339647 A1* | 11/2014 | Rashed ............... G06F 17/5072 257/401 |
| 2015/0061020 A1* | 3/2015 | Yokoyama .......... H01L 27/0694 257/347 |
| 2015/0179785 A1* | 6/2015 | Govindaraju ......... H01L 29/785 257/401 |
| 2015/0349125 A1 | 12/2015 | Chen |

* cited by examiner

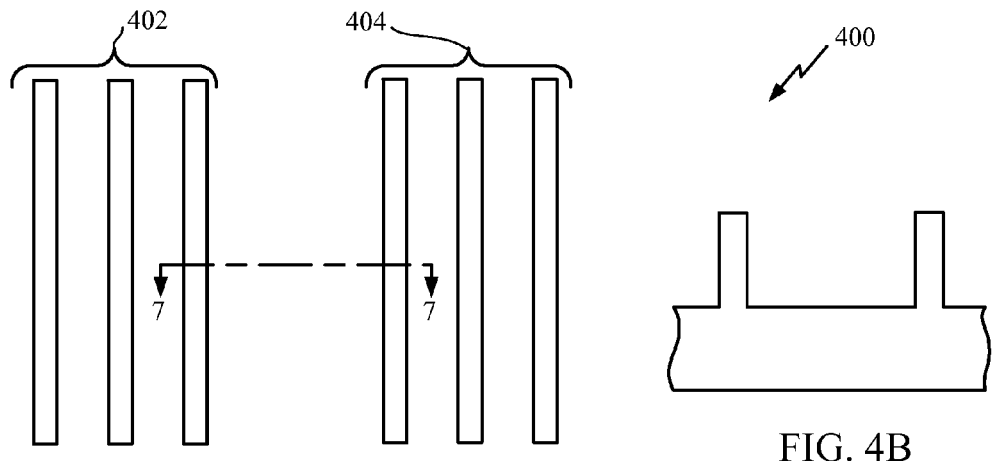
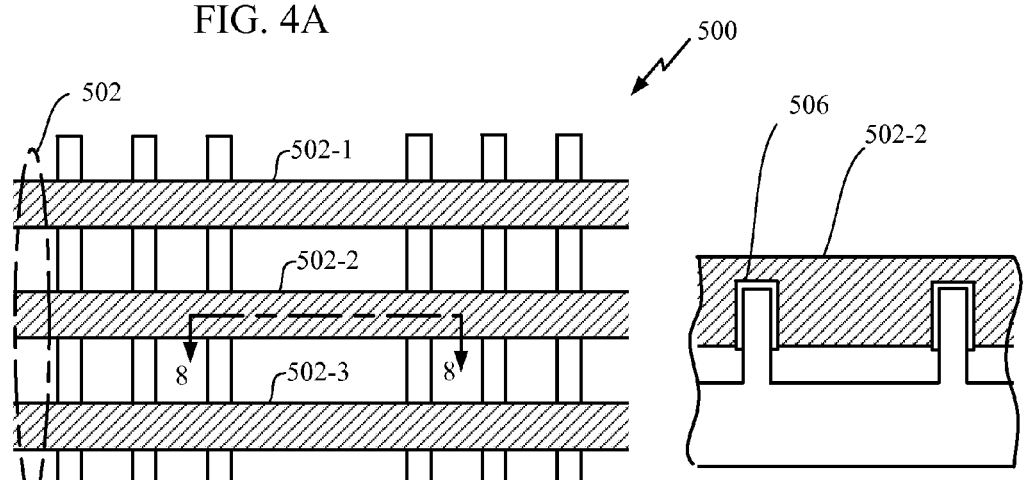
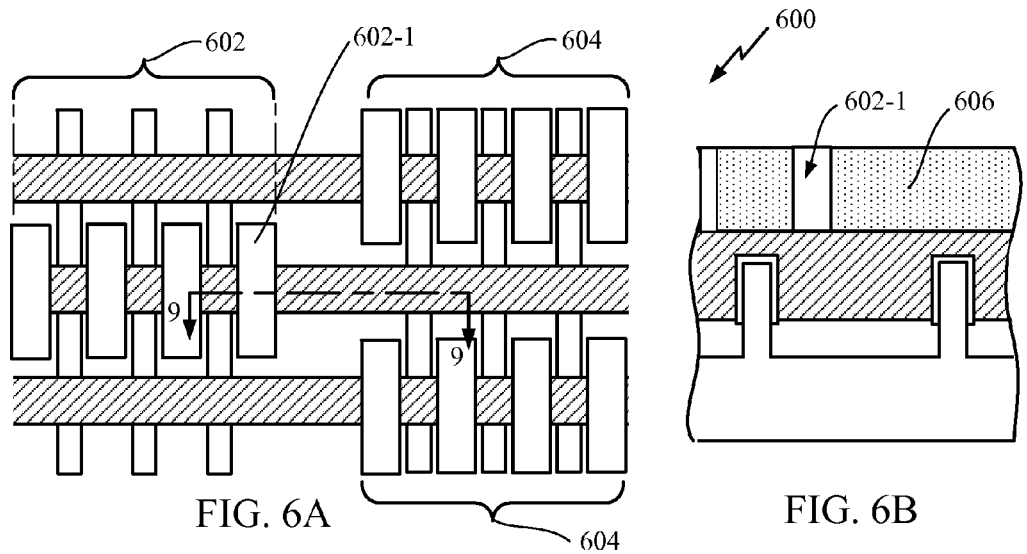

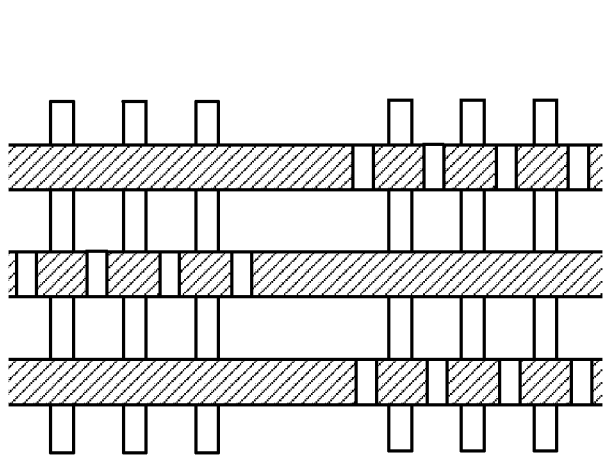
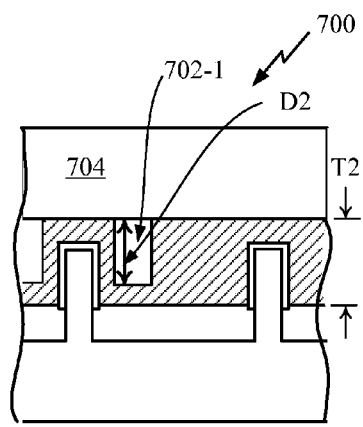
FIG. 7A
FIG. 7B
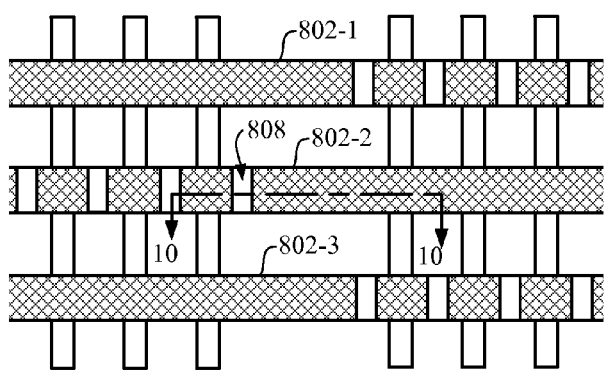
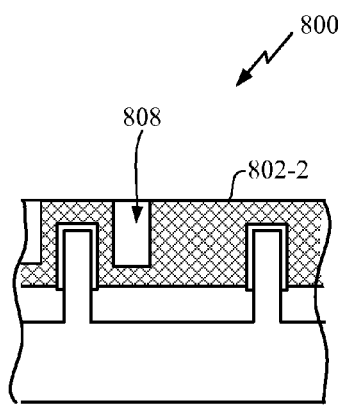
FIG. 8A
FIG. 8B
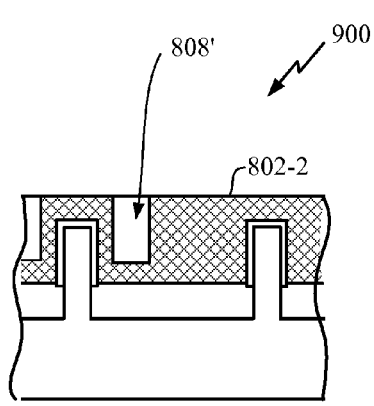
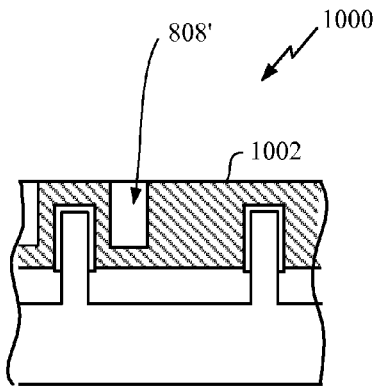
FIG. 9
FIG. 10

FINFET WITH CUT GATE STRESSOR

FIELD OF DISCLOSURE

The present application is generally related to transistor structure and, more particularly, to finned field effect transistor (finned FET or FinFET) devices.

BACKGROUND

It is known that application of certain stresses to the crystalline lattice in the channel region of a FinFET device can reduce gate delay and increase switching speed. It is also known that for N-channel (NMOS) FinFETs and P-channel (PMOS) FinFETs, the respective relation between the direction of the stresses and the resulting change in performance, i.e., improvement or degradation, can be mutually opposite. For example, in an NMOS FinFET, tensile stress along the channel direction (i.e., the extending direction of the fin), can increase electron mobility, hence, improve the FinFET speed. However, in a PMOS FinFET the opposite can hold true in, namely, tensile stress can degrade performance while compressive stress increases electron mobility.

Conventional stressor element techniques can therefore include NMOS FinFET stressors and PMOS FinFET stressors, having substantial mutual differences in structure and materials, so as to induce respectively opposite stresses. The differences in structure and materials can add costs to the fabrication process.

SUMMARY

This Summary identifies some example aspects, and is not an exhaustive description of disclosed subject matter. Whether a feature is included in, or omitted from the Summary is not intended as an indicator of relative importance. Additional features and aspects are described, and will become apparent to persons skilled in the art upon reading the following detailed description and viewing the drawings that form a part thereof.

FinFET devices are disclosed, and example features of one or more of the FinFET devices can include a fin, formed of a semiconductor, configured to extend in a fin direction, and having a channel region. Features may also include, for example, a gate-stressor member, extending transverse to the fin direction, formed of a metal and having a gate surface, and the gate surface can be configured to straddle and engage the fin in the channel region. Features may also include at least two transverse stressor members, each formed of a metal, and configured to straddle and engage the fin at a respective at least two regions outside of the channel region. In an aspect, the gate-stressor member can be configured to have a partial cut, and the partial cut can be configured to form a partial cut edge adjacent to the fin and spaced from the fin by a cut distance. In an additional aspect, the gate-stressor member can be further configured to cause through the gate surface a transverse stress in the fin, having a magnitude. In another aspect, the at least two transverse stressor members can be configured to cause, at the at least two respective regions outside of the channel region, at least two additional transverse stresses in the fin. In an aspect, the magnitude can be based at least in part on the cut distance, and wherein a combination of the magnitude and the at least two additional transverse stresses in the fin induces a longitudinal compressive strain in the channel region.

Various methods for selective setting of longitudinal strain in FinFET fin channel regions are disclosed. In an aspect, operations in one or more of the various methods can include, for example, forming a set of fins, extending parallel to a given common axis, wherein each fin in the set of fins can include a channel region, and forming a set of in-process gates, wherein each in-process gate in the set of in-process gates can be formed of a metal, and wherein each in-process gate in the set of in-process gates can be configured to straddle and to engage each fin in the set of fins. In another aspect, operations can include, for example, forming in a selected in-process gate of the set of in-process gates a pattern of partial cuts, wherein the pattern of partial cuts may be configured to form a partial cut edge adjacent to and spaced a respective distance from a fin from the set of fins, wherein the respective distance can be configured to set, least in part, a transverse stress that the selected in-process gate causes in the fin.

Additional FinFET devices are disclosed and example features of one or more of the additional FinFET devices can include a fin, formed of a semiconductor, configured to extend in a fin direction. Additional features can include, for example, a channel region, and a gate-stressor member, extending transverse to the fin direction, formed of a metal and having a gate surface, wherein the gate surface can configured to straddle and engage the fin in the channel region. Features can also include, for example, at least two transverse stressor members, formed of a metal, and configured to straddle and engage the fin at respective regions outside of the channel region. In an aspect, the gate-stressor member can be configured to cause, through the gate surface, a transverse stress in the fin, having a transverse stress magnitude. In another aspect, the least two cuts can be configured to form respective edges adjacent to and spaced from the fin by respective cut distances. In an aspect, the at least two transverse stressor members can be further configured to cause, at the respective regions outside of the channel region, respective additional transverse stresses in the fin, having respective magnitudes, and the respective magnitude can be based at least in part on the respective cut distances. In a further aspect, the respective cut distances can be set wherein a combination of the transverse stress magnitude and the respective magnitudes can induce a longitudinal tensile strain in the channel region.

A method for selective setting of longitudinal strain in FinFET fin channel regions are disclosed, and operations can include, for example, forming a set of fins, extending parallel to a given common axis, and each fin in the set of fins can include a channel region. In an aspect, operations may also include, for example, forming a set of dummy gates, and each dummy gate in the set of dummy gates can be formed of a polysilicon, and each dummy gate in the set of dummy gates can be configured to straddle and engage each fin in the set of fins. In an aspect, operations may also include, for example, forming a pattern of partial cuts, in a selected dummy gate of the set of dummy gates, wherein the pattern of partial cuts may be configured to form a partial cut polysilicon edge adjacent to and spaced a respective distance from each fin of the set of fins. In an aspect, operations can also include, for example, replacing each dummy gate of the set of dummy gates with a metal, to form a set of in-process metal gate members, wherein the set of in-process metal gate members can include an in-process metal gate member that corresponds to the selected dummy gate. In an aspect, the in-process metal gate member that corresponds to the selected dummy gate can be configured to cause a transverse stress in each fin of the set of fins, and that transverse stress in each fin of the set of fins can have a magnitude that corresponds to the respective distance from each fin in the set of fins.

BRIEF DESCRIPTION OF THE DRAWINGS

The accompanying drawings are presented to aid in the description of aspects, and are provided solely for illustrative examples according to and showing aspects, and are not a limitation thereof.

FIGS. 4A-7B show, by snapshot sequence, example operations in part of a process of fabricating one example PCG stressed fin NMOS/PMOS FinFET device.

FIG. 4A shows a top projection view of one in-process structure including one example set of P-channel fins and one example neighboring set of N-channel fins, according to one or more aspects.

FIG. 4B is a cut-away front projection view of the FIG. 4A in-process structure, from the FIG. 4A front projection cutting plane 7-7.

FIG. 5A shows a top projection view of one subsequent in-process structure including the FIG. 4A-4B in-process structure, after formation of in-process gates.

FIG. 5B is a cut-away front projection view of the FIG. 5A subsequent in-process structure, from the FIG. 5A cutting plane 8-8.

FIG. 6A shows a top projection view of next subsequent in-process structure, including the FIG. 5A-5B in-process structure, after formation of masks for PCG stressed channel NMOS FinFETs and PCG stressed channel PMOS FinFET.

FIG. 6B is a cut-away front projection view of the FIG. 6A next subsequent in-process structure, from the FIG. 6A cutting plane 9-9.

FIG. 7A shows a top projection view of one final (with respect to the illustrated portion of the fabrication) in-process structure 700, formed by partial etching using the masks of the FIG. 6A in-process structure.

FIG. 7B is a cut-away front projection view of the FIG. 7A final in-process structure, from the FIG. 7A cutting plane 10-10.

FIGS. 8A-10 show, by snapshot sequence, example operations in part of one alternative process for forming partial cuts.

FIG. 8A shows a top projection view of an in-process structure having poly silicon dummy gates, with a partial gate cut in the dummy gates.

FIG. 8B is a cut-away front projection view of the FIG. 8A in-process structure, from the FIG. 8A cutting plane 11-11.

FIG. 9 shows a next in-process structure, from the FIG. 8A cutting plane, formed by ILD deposition and planarization to fill the FIG. 8A-8B partial cut in the poly silicon dummy gate.

FIG. 10 shows a next in-process structure, from the FIG. 8A cutting plane, formed by removing FIG. 8A-9B poly silicon dummy gates and applying a replacement metal gate process.

DETAILED DESCRIPTION

Figure 1A:
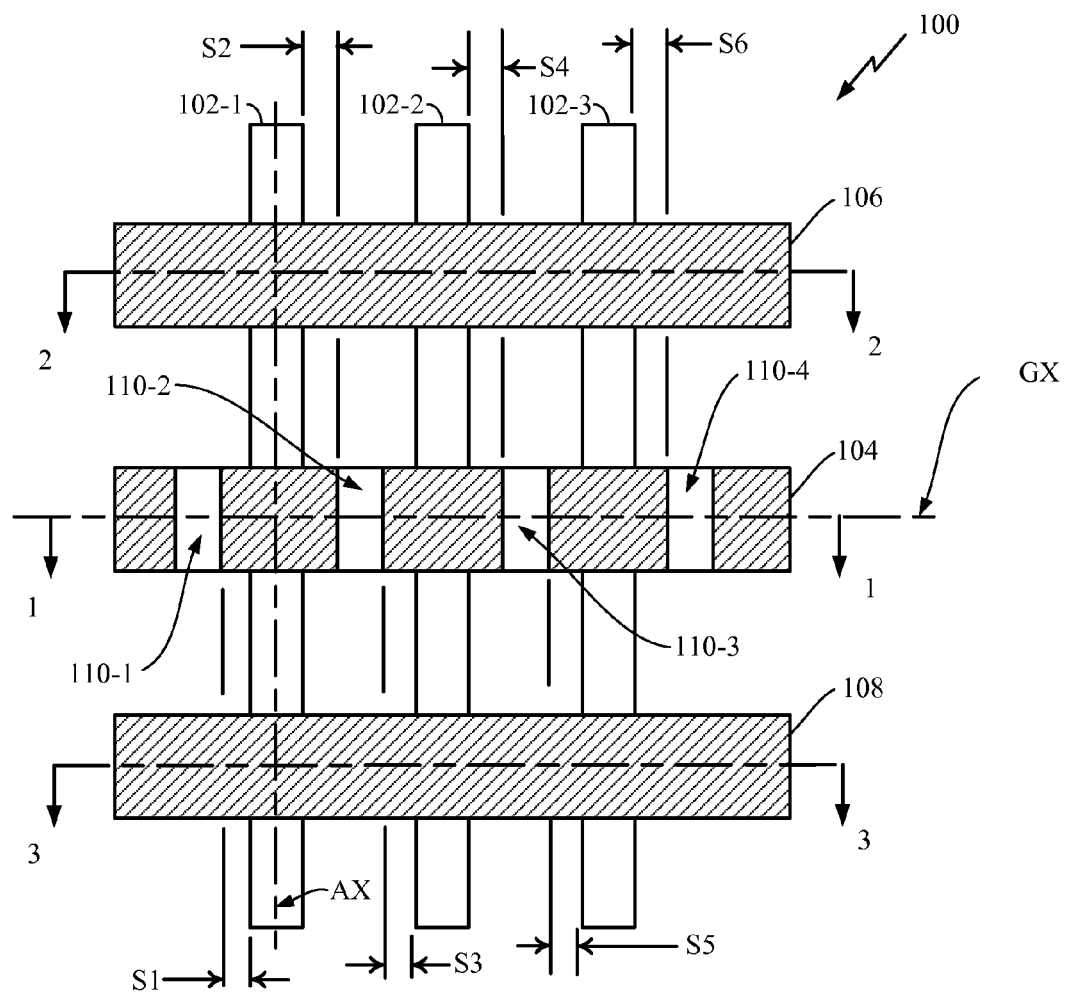
FIG. 1A is a top projection view one example set of partial cut gate (PCG) stressed fin PMOS FinFET devices according to one or more aspects.

Aspects are disclosed in the following description and related drawings. Various alterations that do not depart from the scope of the disclosed aspects may become apparent upon reading this disclosure. Additionally, in description of certain example applications, implementations and operations related to same, instances are identified, explicitly or implicitly from the described context, where known conventional techniques may be employed for certain components and acts. In such instances, detailed description of the employed conventional techniques may be omitted so as not to obscure relevant details of the invention.

The word "exemplary" is used herein to mean "serving as an example, instance, or illustration." Any aspect or example configuration of same that described herein as "exemplary" is not necessarily to be construed as preferred or advantageous over other aspects or configurations. Likewise, discussion of a feature, advantage or mode of operation in relation to the term "aspects of the invention" does not imply that all aspects of the invention include the discussed feature, advantage or mode of operation.

The terminology used herein is for the purpose of describing particular aspects only and is not intended to be limiting of the invention. As used herein, the singular forms "a," "an," and "the" are intended to include the plural forms as well, unless the context clearly indicates otherwise. In addition, the terms "comprises," "comprising," "includes" and/or "including," as used herein, specify the presence of stated features, integers, steps, operations, elements, and/or components, but do not preclude the presence or addition of one or more other features, integers, steps, operations, elements, components, and/or groups thereof.

Further, certain aspects are described in terms of example operations. It will be understood that except where otherwise described such operations can be performed by specific circuits (e.g., application specific integrated circuits (ASICs)), by program instructions being executed by one or more processors, or by a combination of both. In addition, specific circuits (e.g., ASICs), processors and program instructions executed by one or more of the same may be described as "logic configured to" perform described operations and action(s). Additionally, sequences of actions described herein can be considered to be embodied entirely within any form of computer readable storage medium having stored therein a corresponding set of computer instructions that upon execution would cause an associated processor to perform the functionality described herein. Thus, various aspects may be embodied in a number of different forms, all of which are contemplated to be within the scope of the claimed subject matter.

One example partial cut gate (PCG) FinFET device according to various aspects may include a semiconductor fin, extending in a fin direction and having a channel region between a first distal region and a second distal region. The example PCG FinFET may include a gate-stressor member, formed of a metal and extending transverse to the fin direction, with a gate surface that straddles the fin at the channel region. The example PCG FinFET may include, in an aspect, a first transverse stressor member, formed of the metal, and extending parallel to the gate-stressor member. The first transverse stressor member may be configured to form a first distal engagement surface that straddles the fin at the first distal region. The example PCG FinFET may include, in a further aspect, a second transverse stressor member, formed of the metal, and extending parallel to the gate-stressor member. The second transverse stressor member may be configured to form a second distal engagement surface that straddles the fin at the second distal region.

In the example PCG FinFET, the gate-stressor member can produce or cause, at least in part through the gate surface, a channel region transverse stress within the channel region. For purposes of this description, "transverse," when used to label or describe stresses or strains, means in a direction that is transverse to the fin direction, and normal to the sidewalls of the fin. The channel region transverse stress can have a channel region transverse stress magnitude. In aspect, the first transverse stressor member can be configured to cause, through the first distal engagement surface, a first distal transverse stress within the first distal region of the fin, having a first distal transverse stress magnitude. The second transverse stressor member, in a like aspect, can be configured to cause, through the second distal engagement surface, a second distal transverse stress within the second distal region of the fin, having a second distal transverse stress magnitude.

According to various aspects, one or more of the gate-stressor member, the first transverse stressor member and the second transverse stressor member of the PCG FinFET can be formed with a selected arrangement and distribution of partial cuts, each partial cut having a respective distance to the fin. In an aspect, the gate-stressor member, the first transverse stressor member and the second transverse stressor member can be configured such that an adjustment or change of the arrangement and distribution of partial cuts can cause, at least in part, a corresponding adjustment or change in a relation of numerical values of the channel region transverse stress magnitude, the first distal transverse stress magnitude and the second distal transverse stress magnitude.

In an aspect, one or more arrangements and distributions of the partial cuts can establish the relation of numerical values at first predetermined relation, which can result in or cause a longitudinal tensile strain in the channel region. In another aspect, one or more other arrangements and distributions of the partial cuts can establish the relation of numerical values at a second predetermined relation, which can result in or cause a longitudinal compressive strain in the channel region.

FIG. 1A is a top projection view one example set of partial cut gate (PCG) stressed fin PMOS FinFET device 100 according to one or more aspects.

Referring to FIG. 1A, in an aspect, the PCG stressed fin PMOS FinFET device 100 device can include, for example, three fins, such as a first fin 102-1, a second fin 102-2 and a third fin 102-3, formed of a semiconductor material and all extending parallel to a fin direction AX. For brevity in describing example features and operations, the first fin 102-1, the second fin 102-2 and the third fin 102-3 will be referenced collectively as "fins 102" (a reference number not separately visible on FIG. 1A). It will be understood that three fins is only one example quantity, and is not intended to limit the scope of any aspect. For example, upon reading the present disclosure, persons of ordinary skill in will readily understand that disclosed concepts and aspect can be practiced using two or even one fin 102, and/or by using four or more fins 102.

Referring to FIG. 1A, the PCG stressed fin PMOS FinFET device 100 can comprise a gate-stressor member 104, and a plurality of transverse stressor members, such as a first transverse stressor member 106 and a second transverse stressor member 108, each of which is visible in part in FIG. 1A. The gate-stressor member 104 can extend along an axis GX that is transverse to the fin direction AX, and can be configured to perform, electrically, as a multi-fin gate of an operational FinFETs gate in an end product having the fins 102 (not fully visible in FIG. 1).

Figure 1B:
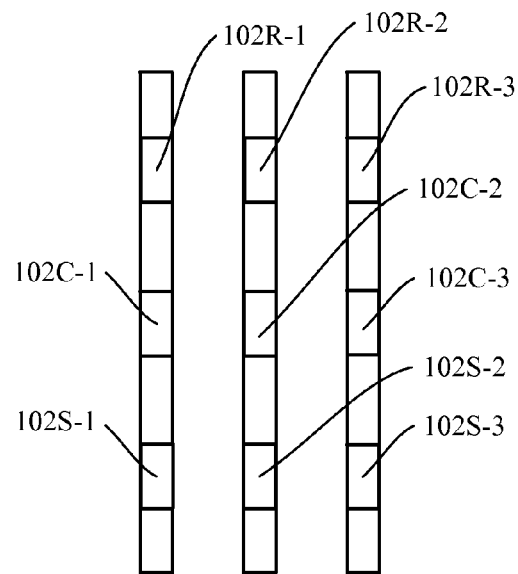
FIG. 1B is the top projection view of FIG. 1 with components removed for visibility of obstructed structure.

FIG. 1B is a view of the PCG stressed fin PMOS FinFET device 100 from the same top projection as FIG. 1A, with the gate-stressor member 104, the first transverse stressor member 106 and the second transverse stressor member 108 removed. Referring to FIG. 1B, the first fin 102-1 may extend from or through a first fin first distal region 102R-1 to or through a first fin second distal region 102S-1, and can include, intervening region, a first fin channel region 102C-1. The second fin 102-2 may similarly comprise a second fin channel region 102C-2, a second fin first distal region 102R-2 and a second fin second distal region 102S-2, and the third fin 102-3 may comprise a third fin channel region 102C-3, a third fin first distal region 102R-3 and a third fin second distal region 102S-3.

Figure 1C:
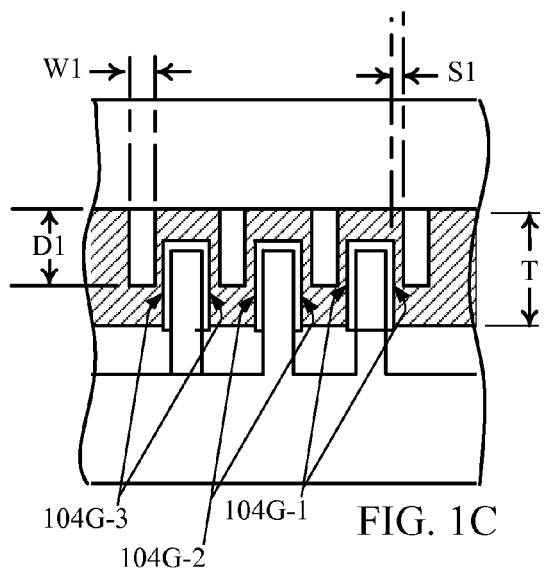
FIG. 1C is a cut-away front projection view of the FIG. 1A set of PCG stressed fin PMOS FinFET devices, from the FIG. 1A cutting plane 1-1.

FIG. 1C is a cut-away front projection view of the FIG. 1A PCG stressed fin PMOS FinFET device 100, from the FIG. 1A front projection cutting plane 1-1.

Referring to FIG. 1C, the gate-stressor member 104 can provide a first fin gate surface 104G-1 that may straddle and engage the first fin 102-1 in the first fin channel region 102C-1, a second fin gate surface 104G-2 that may straddle and engage the second fin 102-2 in the second fin channel region 102C-2, and a third fin gate surface 104G-3 that may straddle and engage the third fin 102-3 in the third fin channel region 102C-3. In an aspect, incidental to their configuration, the first fin gate surface 104G-1, second fin gate surface 104G-2, and third fin gate surface 104G-3, can effectuate a mechanical engagement of the gate-stressor member 104 with the gate regions 102G of each of the fins 102. In an aspect, the first transverse stressor member 106-1 can be structured to effectuate a similar mechanical engagement of it with the first distal region 102R of each of the fins 102. The first transverse stressor member 106-1. Similarly, the second transverse stressor member 108 can be structured to effectuate a mechanical engagement of it with the second distal region 102S of each of the fins 102. Non-limiting examples of such structure will now be described.

In an aspect, referring to FIGS. 1A and 1C, the gate-stressor member 104 can include regions (visible but not separately labeled) having full thickness T, and can include, for example, at least one partial cut—such as the first partial cut 110-1 that is associated with the first fin 102-1—associated with each of the fins 102. Referring to FIGS. 1A and 1C, the partial cuts in the gate-stressor member 104 can have a first partial cut 110-1 and a second partial cut 110-2. The first fin 102-1 can be arranged between the first partial cut 110-1 and the second partial cut 110-2, and the second partial cut 110-2 being arranged between the first fin 102-1 and the second fin 102-2. The partial cuts may also include a third partial cut 110-3, and a fourth partial cut 110-4. The third partial cut 110-3 may be arranged between the second fin 102-2 and the third fin 102-3, and the third fin 102-3 may be arranged between the third partial cut 110-3 and the fourth partial cut 110-4. For brevity, the first partial cut 110-1, second partial cut 110-2, third partial cut 110-3 and fourth partial cut 110-4 will be referenced collectively as "partial cuts 110" (not explicitly visible as a separate reference number in the figure).

To avoid unnecessary complexity of details not related to fundamental concepts, description of example aspects of the partial cuts 110 will assume the gate-stressor member 104, the first transverse stressor member 106 and the second transverse stressor member 108 are respectively structured such that, if the partial cuts 110 were not formed, each would induce or effect the same magnitude of compressive stress at the respective regions of the fins 102 that each engages. In an aspect, functionality of the partial cuts in the gate-stressor member 104 can include reducing a stress that the gate-stressor member 104 would apply to the fins 102 in the absence of the partial cuts 110.

In an aspect, the first partial cut 110-1 can be configured to form a first partial cut edge adjacent to the first fin 102-1 and spaced from the first fin 102-1 by a distance S1. The second partial cut 110-2 can be configured to form a second partial cut first edge adjacent to the first fin 102-1 and spaced from the first fin 102-1 by a distance S2, and to form a second partial cut second edge adjacent to the second fin 102-2 and spaced from the second fin 102-2 by a distance S3. The third partial cut 110-3 may be configured to form a third partial cut first edge adjacent to the second fin 102-2 and spaced from the second fin 102-2 by a distance S4. The third partial cut 110-3 may also be configured to form a third partial cut second edge adjacent to the third fin 102-3 and spaced from the third fin 102-3 by a distance S5. Lastly, for this example, the fourth partial cut 110-4 can be configured to form a fourth partial cut edge adjacent to the third fin 102-3 and spaced from the third fin 102-1 by a distance S6.

Referring to FIG. 1A, it is seen that each fin 102 has, on one side, a fin first partial cut adjacent to the fin and spaced from the fin by a first partial cut distance and, on another side, a fin second partial cut adjacent to the fin and spaced from the fin by a first second cut distance. The fin first partial cut distance and the fin second partial cut distance may be equal. Accordingly, looking at FIG. 1A the distance S1 can be termed a "first fin cut distance" S1; the distance S2 can be termed a "first fin second cut distance" S2; the distance S3 can be termed a "second fin first cut distance" S3; and the distance S4 can be termed a "second fin second cut distance" S4, the distance S5 can be termed a "third fin first cut distance S5"; and the distance S6 can be termed a "third fin second cut distance S6." For brevity the first fin cut distance S1, the first fin second cut distance S2, second fin first cut distance S3, second fin second cut distance S4, third fin first cut distance S5, and third fin second cut distance S6 will be referenced collectively as "respective distances of the partial cuts 110. In an aspect, the respective distances of the partial cuts 110 can all be identical (other than processing variations). In another aspect, the respective distances of the partial cuts 110 can be, for example, according to a set of values or nominal values.

Figure 1D:
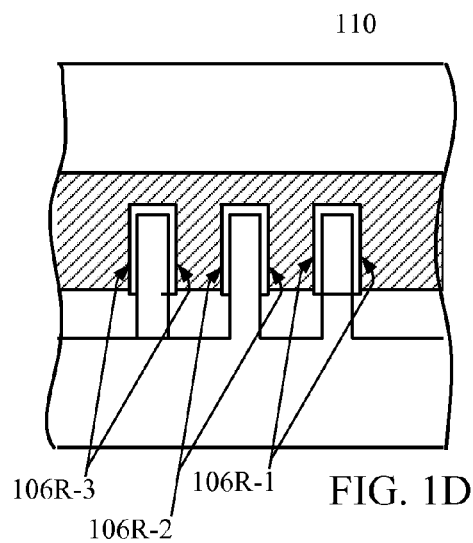
FIG. 1D is a cut-away front projection view of the FIG. 1A set of PCG stressed fin PMOS FinFET devices, from the FIG. 1A cutting plane 2-2.

FIG. 1D is a cut-away front projection view of the FIG. 1A PCG stressed fin PMOS FinFET device, from the FIG. 1A front projection cutting plane 2-2.

Referring to FIG. 1D, in an aspect, the first transverse stressor member 106 can be configured to have a first fin first distal engagement surface 106R-1, configured to straddle and engage the first fin 102-1 in the first fin first distal region 102R-1. The first transverse stressor member 106 can also be configured to form a second fin first distal engagement surface 106D-2, configured to straddle and engage the second fin 102-2 in the second fin first distal region 102R-2, as well as a third fin first distal engagement surface 106R-3, configured to straddle and engage the third fin 102-3 in the third fin first distal region 102R-3.

Continuing to refer to FIG. 1D, the first fin first distal engagement surface 106R-1 can be structured, for example, substantially the same as the first fin gate surface 104G-1 of the gate-stressor member 104. Differences such as work function layers (not explicitly visible in the figures) provided for the gate surfaces 104G are not relevant to aspects disclosed herein and, therefore, further detailed description is omitted. In like manner, the second fin first distal engagement surface 106R-2 can have structure substantially replicating the second fin gate surface 104G-2, and the third fin first distal engagement surface 106R-3 can substantially replicate the third fin gate surface 104G-3. For brevity, the first fin first distal engagement surface 106R-1, second fin first distal engagement surface 106R-2, and third fin first distal engagement surface 106R-3 will be referenced collectively as "first distal engagement surfaces 106R" and generically as "first distal engagement surface 106R" (where "106R" is a reference number not separately visible in the figures).

In an aspect, the first transverse stressor member 106 can be configured to cause, through each first distal engagement surface, a first distal transverse stress in the first distal region 102R of each of the fins 102. The first transverse stressor member 106 can be configured wherein first distal transverse stress can have a first distal transverse stress magnitude.

Figure 1E:
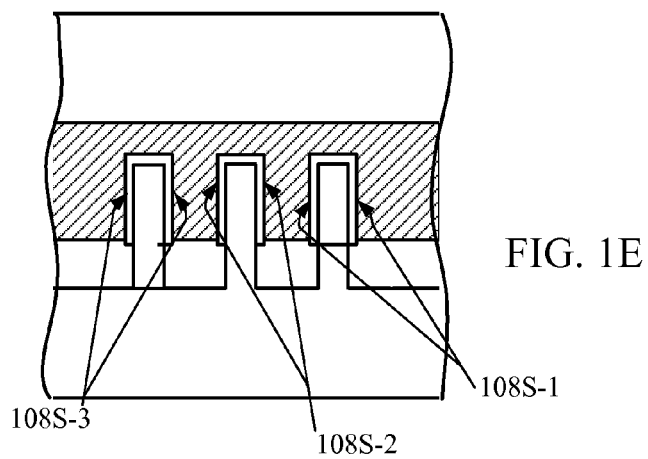
FIG. 1E is a cut-away front projection view of the FIG. 1A set of PCG stressed fin PMOS FinFET devices, from the FIG. 1A cutting plane 3-3.

FIG. 1E is a cut-away front projection view of the FIG. 1A set of PCG stressed fin PMOS FinFET device 100, from the FIG. 1A front projection cutting plane 3-3. In an aspect, the second transverse stressor member 108 can provide a first fin second distal engagement surface 108S-1, configured to straddle and engage the first fin 102-1 in the first fin second distal region 102S-1, and can provide a second fin second distal engagement surface 108S-2, configured to straddle and engage the second fin 102-2 in the second fin second distal region 102S-2, and a third fin second distal engagement surface 108S-3, configured to straddle and engage the third fin 102-3 in the third fin second distal region 102S-3. For brevity, the first fin second distal engagement surface 108S-1, second fin second distal engagement surface 108S-2, and third fin second distal engagement surface 108S-3 will be referenced collectively as "second distal engagement surfaces 108S" (a reference number not separately visible in the figures) and generically as "second distal engagement surface 108S."

In an aspect, the second transverse stressor member 108 can be configured to cause, through each second distal engagement surface 108S, a second distal transverse stress in the second distal region 102S of each of the fins 102. The second transverse stressor member 108 can be configured wherein the second distal transverse stress can have a second distal transverse stress magnitude.

Figure 1F:
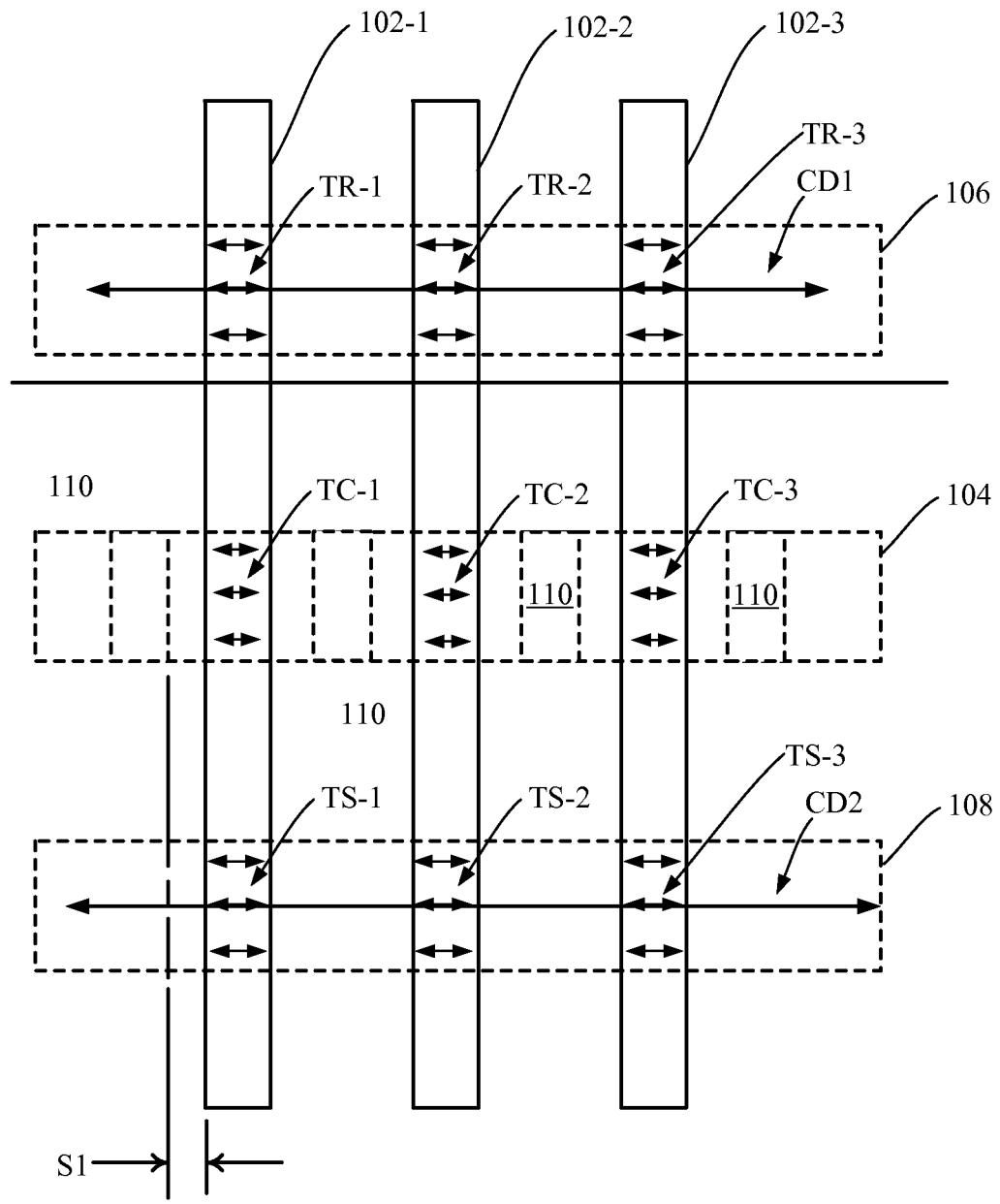
FIG. 1F is an enlarged view of the MCG stressed fin PMOS FinFET device 100 from the same top projection as FIG. 1A, with certain structure rendered in transparent skeleton form for visibility, and annotated with graphic representations of certain stresses and strains.

FIG. 1F is an enlarged view of the PCG stressed fin PMOS FinFET device 100 from the same top projection as FIG. 1A, with the gate-stressor member 104, the first transverse stressor member 106 and the second transverse stressor member 108 rendered in transparent skeleton form for visibility, and annotated with graphic representations of certain stresses and strains.

Referring to FIG. 1F, in an aspect, the first transverse stressor member 106 and the second transverse stressor member 108 can be configured to be in similar states of longitudinal compressive stress (with respect to their extending directions). The compressive stress in the first transverse stressor member 106 is represented by an arrow labeled "CD1" and, in the second transverse stressor member 108, is represented by an arrow labeled "CD2." The respective magnitudes of the compressive stresses CD1 and CD2 may be, but are not necessarily equal.

Without subscribing to any theory, effects of the compressive stress CD1 may include an urging or transfer of stress to the first fin first distal engagement surface 106R-1, having at least components directed toward opposing lateral surfaces of the first fin first distal region 102R-1. This, in turn, can induce or cause a first transverse stress in the first fin first distal region 102R-1. The first transverse stress in the first fin first distal region 102R-1 can be referred to as a "first fin first transverse stress." Referring to FIG. 1F, the arrows labeled "TR1" are a graphical representation of such stress. The first compressive stress CD1 can likewise induce or cause, through the second fin first distal engagement surface 106R-2 and third fin first distal engagement surface 106R-3, a second fin first transverse stress in the second fin first distal region 102R-2, and a third fin first transverse stress in the third fin first distal region 102R-3. The arrows labeled "TR2" and "TR3" are respective graphical representations of such stress.

Referring to FIG. 1F, effects of the compressive stress CD2 can induce or cause, for example, through the second distal engagement surface 108S of the second transverse stressor member 108, a second transverse stress in any of the second distal regions 102S. For example, effects of the compressive stress CD2 can induce a first fin second transverse stress in the first fin second distal region 102S-1, a second fin second transverse stress in the second fin second distal region 102S-2 and a third fin second transverse stress in the third fin second distal region 102S-3. The arrows labeled "TS1," "TS2" and "TS3" are respective graphical representations of such stress. For brevity, the transverse compressive stresses represented by the arrows labeled "TR1," "TR2," "TR3," "TS1," "TS2," and "TS3," will be referenced collectively as "distal region channel transverse stresses TR/TS" (a label not separately visible in the figures).

Referring to FIG. 1F, in an aspect, the gate-stressor member 104 can cause, for example through the gate surfaces 104G, a transverse stress in each of the channel regions 102C. The transverse stress can include a first fin channel region transverse stress TC1, a second fin channel region transverse stress TC2, and a third fin channel region transverse stress TC3. The first fin channel region transverse stress TC1 has a first fin channel region transverse stress magnitude, the second fin channel region transverse stress TC2 has a second fin channel region transverse stress magnitude, and the third fin channel region transverse stress TC3 has a third fin channel region transverse stress magnitude. The first fin channel region transverse stress TC1, second fin channel region transverse stress TC2, and third fin channel region transverse stress TC3 will be referenced collectively as "channel region transverse stresses TC" (a label not separately visible in the figures).

Referring to FIG. 1A, the PCG stressed fin PMOS FinFET device 100 shows one example arrangement and distribution of partial cuts 110 that places, for each of the channel regions 102C, at least one edge of a partial cut 110 adjacent that channel region's opposing lateral sides (visible but not separately labeled). Examples of respective distances from the edges of the partial cuts 110 adjacent to the channel regions, as described above, are the first fin cut distance S1, the first fin second cut distance S2, second fin first cut distance S3, second fin second cut distance S4, third fin first cut distance S5, and third fin second cut distance S6. These are referenced collectively as respective distances of the partial cuts 110.

In a general aspect, in devices structured as the PCG stressed fin PMOS FinFET device 100, for each of the fins 102, reducing the respective distances of the partial cuts 110 can correspondingly lower the transverse compressive stress in that fin's channel region 102C. Similarly, increasing the respective distances of the partial cuts 110 can correspondingly increase the transverse compressive stress in that fin's channel region—up to a maximum that would result if the partial cuts 110 were omitted. The arrangement and distribution of partial cuts 110 in the PCG stressed fin PMOS FinFET device 100 includes, in an aspect, setting the width of the partial cuts 110 (one example labeled "W1') according to the spacing between adjacent fins 102. In an aspect, increasing and decreasing the depth D1 of partial cuts 110 can cause a corresponding decrease and increase in the channel region compressive stresses TC. As the depth D1 is increased, though, the electrical resistance of the gate-stressor member 104 increases.

In an aspect, in structures such as the example PCG stressed fin PMOS FinFET device 100, when the channel region transverse compressive stresses TC are lower than the distal region transverse compressive stresses TR/TS, a longitudinal compressive strain can be established in the channel regions 102C of the fins 102.

Referring to FIG. 1F, the FIG. 1 example PCG stressed fin PMOS FinFET assumes the partial cuts 110 are configured, e.g., the depth D1 and respective distances of the partial cuts 110 are set, such that the channel region transverse compressive stresses TC are sufficiently lower than the distal region transverse compressive stresses TR/TS to establish in the channel regions 102C the longitudinal compressive strain. As will be understood by persons of ordinary skill upon reading this disclosure, in operational PMOS FinFET devices utilizing the PCG stressed fin PMOS FinFET device 100, the longitudinal compressive strain increases electron mobility in their channels (i.e., structure utilizing the channel regions 102C).

Regarding specific numerical ranges of longitudinal compressive strain necessary to meet application needs, persons of ordinary skill will understand, upon reading this disclosure, that a quantity and range of application-specific variables may render estimates of such numbers, in the abstract, not helpful. Persons of ordinary skill, though, when facing a range of specific applications, can determine such numerical ranges and corresponding parameters for the partial cuts 110, without undue experimentation, upon reading the present disclosure and adapting conventional techniques, e.g., simulation tools that are known to such persons.

The PCG stressed fin PMOS FinFET device 100 was described having three fins 102. Configurations of the PCG stressed fin PMOS FinFET device 100 are contemplated having, for example, one fin. In one example one fin configuration (not explicitly visible in the figures) the gate-stressor member can be configured to have a fin gate surface, configured to straddle and engage the fin channel region of the fin, and to cause a transverse stress, for example, as described for the three fin example PCG stressed fin PMOS FinFET device 100. In addition, in one example one fin configuration, the gate-stressor member is configured to have a partial cut. In other example one fin configuration, the gate-stressor member may be configured to have a partial cut. In an aspect, the partial cut is configured to form a partial cut edge adjacent to the fin, and spaced from the fin by a partial cut distance. In another aspect, the partial cut may be configured to form a partial cut edge adjacent to the fin, and spaced from the fin by a partial cut distance.

Continuing with the above one fin example, the partial cut can be a first partial cut, and the cut distance can be a first cut distance. The gate-stressor member can be further configured to have a second partial cut, which can be configured to form a partial cut edge adjacent to the fin and spaced from the fin by a second cut distance.

The PCG stressed fin PMOS FinFET device 100 described above is a PMOS device and, accordingly, methods and mechanisms according to its various aspects can provide a channel longitudinal compressive strain.

In another aspect, a PCG stressed NMOS FinFET device can be provided. Examples can include a fin, formed of a semiconductor, configured to extend in a fin direction, and including a channel region. Features may include a gate-stressor member, which can be composed of a metal, and which can extend transverse to the fin direction, and with a gate surface configured to straddle and engage the fin in the channel region. The gate-stressor member may be configured to cause, through the gate surface, a transverse stress in the gate region of the fin, having a transverse stress magnitude. The PCG stressed NMOS FinFET device can also include at least two transverse stressor members, each formed of a metal. In aspect configured to straddle and engage the fin at a respective at least two regions outside of the channel region. In an aspect, the at least two transverse stressor members can be configured to cause, at the respective regions outside of the channel region, additional transverse stresses in the fin. In an aspect, each of the at least two transverse stressor members can be configured to include respective partial cuts. In an aspect, the respective partial cuts can be configured to form respective edges adjacent to and spaced from the fin by respective cut distances. In a further aspect, the additional transverse stresses can have additional transverse stress magnitudes, which can be based, at least in part, on the respective cut distances. In an aspect, the respective cut distances can be set such that, for each fin, a combination of the transverse stress magnitude and the additional transverse stress magnitudes can induce a longitudinal tensile strain in the channel region.

According to various aspects, the fin can be from a set of fins that may be parallel and adjacent to one another, and the gate-stressor member can be additionally configured with fin gate surfaces that straddle and engage the fin channel region of each fin of the set fins. The gate-stressor member can be additionally configured to cause in each fin of the set of fins, through the fin gate surfaces, a transverse stress. According to an aspect, there can be at least two transverse stressor members, each formed of a metal, and each configured to straddle and engage the fin at a respective at least two regions outside of the channel region. In a further aspect, the at least two transverse stressor members can be configured to have respective pluralities of transverse stressor partial cuts. In an aspect, the respective pluralities of transverse stressor partial cuts can be configured to form, for each fin of the set of fins, a partial cut edge adjacent to and spaced from the fin, by a respective distance. According to a further aspect, the additional transverse stresses in each fin of the set of fins can have a respective magnitude, and the respective magnitude can be based at least in part on the respective distance. In an aspect, for each fin of the set of fins, a combination of the respective magnitude of the transverse stress caused by each of the at least two transverse stressor members, and the transverse stress caused by the gate-stressor member, induces a longitudinal tensile strain in the fin channel region.

Figures 2A, 2B:
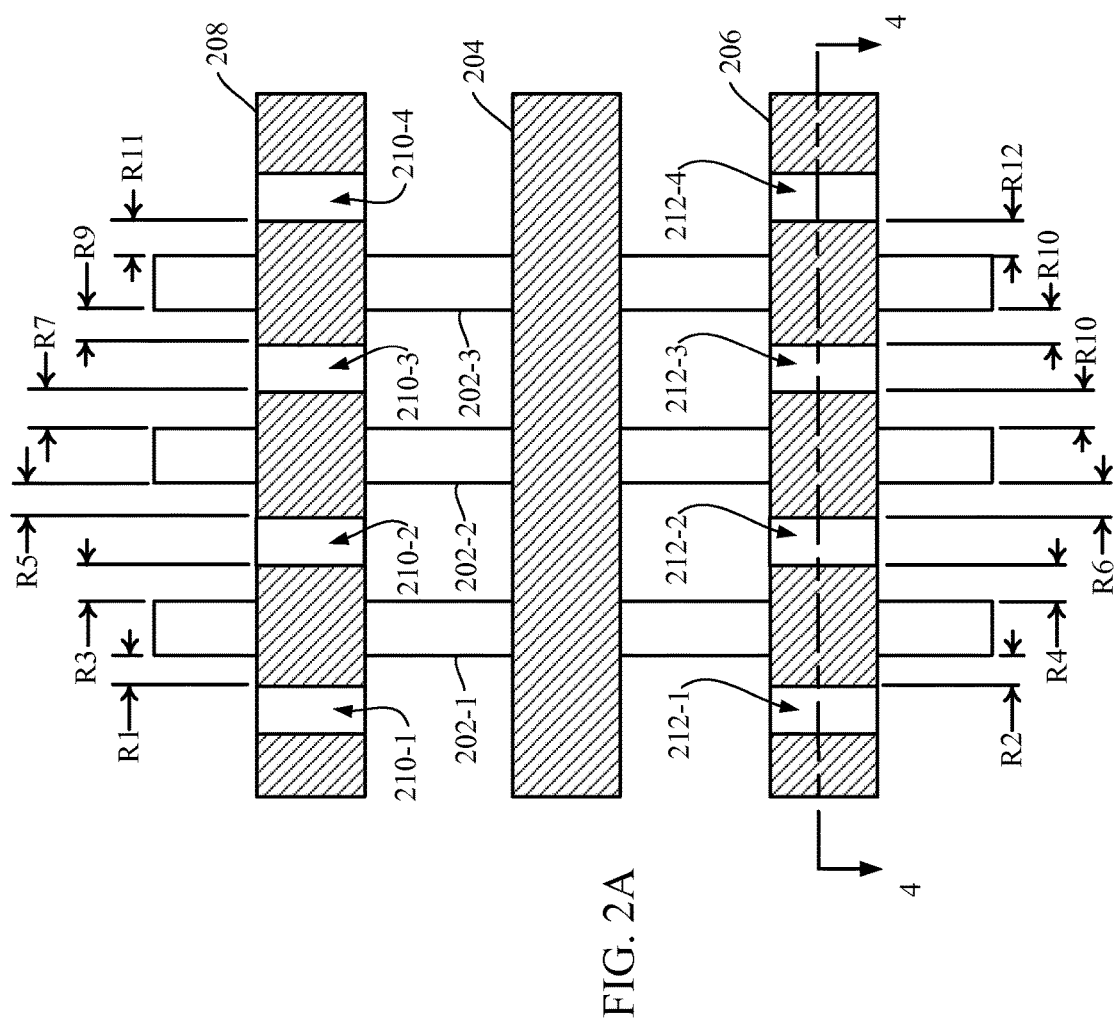
FIG. 2A is a top projection view of one example PCG stressed fin NMOS FinFET device according to one or more aspects.
FIG. 2B is a cut-away front projection view of the FIG. 2A PCG stressed fin NMOS FinFET devices, from the FIG. 2A cutting plane 4-4.

FIG. 2A shows a top projection view one example PCG stressed fin NMOS FinFET device 200 according to one or more aspects. FIG. 2B shows a cut-away front projection view of the FIG. 2A PCG stressed fin PMOS FinFET devices, from the FIG. 2A front projection cutting plane 4-4.

Referring to FIG. 2A, the PCG stressed fin NMOS FinFET device 200 can include a set of fins, for example, a first N-fin 202-1, a second N-fin 202-2 and a third N-fin 202-3, extending in parallel to a fin direction (visible in FIGS. 2A-2B but not separately labeled). The first N-fin 202-1, second N-fin 202-2 and third N-fin 202-3 will be collectively referenced as "N-fins 202" (a reference number that does not appear separately on FIGS. 2A-2B). Each of the N-fins 202 can be formed of a semiconductor material that can be doped according to NMOS FinFET techniques. Each of the N-fins 202 can include a channel region (visible in FIG. 2A but not separately labeled. It will be understood that "N" in the name "N-fins 202" is only a naming to avoid confusion between examples, e.g., with the "fins 102" described above, and has no inherent meaning. It will also be understood that the N-fins 202 comprising three fins is only one example quantity, and is not intended to limit the scope of any aspect.

The PCG stressed fin NMOS FinFET device 200 can include as a gate-stressor member, gate-stressor element 204. The gate-stressor element 204 can be formed of a metal which may be the same metal as the gate-stressor member 104 in the PCG stressed fin PMOS FinFET device 100. The gate-stressor element 204 can be structured such as the gate-stressor member 104, except with the partial cuts 110 omitted. The gate-stressor element 204, in other words, can be configured to straddle each of the N-fins 202, in a channel region of the fin, and to have two functionalities. One of the functionalities is to serve as a gate in the FinFET operation of devices having at least one fin, e.g., one of the N-fins 202. The other functionality is to cause a transverse stress in the channel region of each of the N-fins 202.

Referring to FIG. 2A, the PCG stressed fin NMOS FinFET device 200 can include a first transverse stressor element 206 and a second transverse stressor element 208. The first transverse stressor element 206 can be configured to have a plurality of partial cuts, such as a first transverse stressor first partial cut 210-1, a first transverse stressor second partial cut 210-2, a first transverse stressor third partial cut 210-3 and a first transverse stressor fourth partial cut 210-4. The second transverse stressor element 208 can include another plurality of partial cuts, such as a second transverse stressor first partial cut 212-1, a second transverse stressor second partial cut 212-2, a second transverse stressor third partial cut 212-3 and a second transverse stressor fourth partial cut 212-4. The first transverse stressor first partial cut 210-1, first transverse stressor second partial cut 210-2, first transverse stressor third partial cut 210-3 and first transverse stressor fourth partial cut 210-4 will be collectively referenced as "first transverse stressor partial cuts 210" (a reference label not separately visible on FIGS. 2A-2B). The second transverse stressor first partial cut 212-1, second transverse stressor second partial cut 212-2, second transverse stressor third partial cut 212-3 and second transverse stressor fourth partial cut 212-4 will be collectively referenced as "second transverse stressor partial cuts 212" (a reference label not separately visible on FIGS. 2A-2B). The first transverse stressor partial cuts 210 and the second transverse stressor partial cuts 212 can have a depth, such as the representative depth D2 shown in FIG. 2B, and width, such as the representative width W2.

Referring to FIG. 2A, the first transverse stressor element 206 can be similarly structured and composed of the same metal as the first transverse stressor member 106 described in reference to FIGS. 1A-1F, but modified with first transverse stressor partial cuts 210. The second transverse stressor element 208 can be similarly structured, and similarly modified with second transverse stressor partial cuts 212. For example, the first transverse stressor element 206 can include structure configured to straddle and engage each of the N-fins 202, for example, at a top (relative to the FIG. 2A image) or first distal region (visible but not separately numbered) of the N-fins 202. The second transverse stressor element 208 can include structure configured to straddle and engage each of the N-fins 202, for example, at a lower (relative to the FIG. 2A image) or second distal region (visible but not separately numbered) of the N-fins 202.

In an aspect, the first transverse stressor partial cuts 210 and the second transverse stressor partial cuts 212 can have respective arrangements that, in combination with the gate-stressor member 204, can effectuate a longitudinal tensile stress in the channel regions of the N-fins 202, as opposed to the longitudinal compressive stress in the channel regions 102C of the fins 102 described in reference to FIG. 1F.

Referring to FIG. 2A, in an aspect, the first transverse stressor partial cuts 210 can be configured to form partial cut edges adjacent to, and spaced respective distances from the each of the N-fins 202. In a similar aspect, the second transverse stressor partial cuts 212 can be configured to form partial cut edges adjacent to, and spaced respective distances from each of the N-fins 202.

In an aspect, as visible in FIG. 2A but not separately labeled, the first transverse stressor first partial cut 210-1 can be configured to form a first transverse stressor partial cut edge adjacent to the first N-fin 202-1 and spaced from the first N-fin 202-1 by a first fin first transverse stressor first cut distance R1. In like manner, the second transverse stressor first partial cut 212-1 can be configured to form a second transverse stressor partial cut edge adjacent to the first N-fin 202-1 and spaced from the first N-fin 202-1 by a first fin second transverse stressor first cut distance R2.

Partial cut edges formed by the first transverse stressor second partial cut 210-2, and by the second transverse stressor second partial cut 212-2, which are visible in FIG. 2A but not separately labeled, will be described. Referring to FIG. 2A, the first transverse stressor second partial cut 210-2 can be configured to form a first transverse stressor second partial cut first edge adjacent to the first N-fin 202-1 and spaced from the first N-fin 202-1 by a first fin first transverse stressor second cut distance R3. In like manner, the second transverse stressor second partial cut 212-2 can be configured to form a second transverse stressor second partial cut first edge adjacent to the first N-fin 202-1 and spaced from the first N-fin 202-1 by a first fin second transverse stressor second cut distance R4, and to form a second transverse stressor second partial cut second edge adjacent to the second N-fin 202-2 and spaced from the second N-fin 202-2 by a first fin second transverse stressor first cut distance R6.

Referring to FIG. 2A, the first transverse stressor third partial cut 210-3 can be configured to form a first transverse stressor third partial cut first edge adjacent to the second N-fin 202-2, and spaced from the second N-fin 202-2 by a second fin first transverse stressor second cut distance R7, and to form a first transverse stressor third partial cut second edge adjacent to the third N-fin 202-3 and spaced from the third N-fin 202-3 by a third fin first transverse stressor first cut distance R9. In like manner, the second transverse stressor third partial cut 212-3 can be configured to form a second transverse stressor third partial cut first edge adjacent to the second N-fin 202-2 and spaced from the second N-fin 202-2 by a second fin second transverse stressor second cut distance R8, and to form a second transverse stressor third partial cut second edge adjacent to the third N-fin 202-3 and spaced from the third N-fin 202-3 by a third fin second transverse stressor first cut distance R10.

Referring to FIG. 2A, the first transverse stressor fourth partial cut 210-4 can be configured to form a first transverse stressor fourth partial cut edge adjacent to the third N-fin 202-3 and spaced from the third N-fin 202-3 by a third fin first transverse stressor second cut distance R11. Lastly, for this example, the second transverse stressor fourth partial cut 212-4 can be configured to form a second transverse stressor fourth partial cut edge adjacent to the third N-fin 202-3 and spaced from the third N-fin 202-3 by a third fin second transverse stressor second cut distance R12.

For brevity the first fin first transverse stressor first cut distance R1, first fin second transverse stressor first cut distance R2, first fin first transverse stressor second cut distance R3, first fin second transverse stressor second cut distance R4, second fin first transverse stressor first cut distance R5, second fin second transverse stressor first cut distance R6, second fin first transverse stressor second cut distance R7, second fin second transverse stressor second cut distance R8, third fin first transverse stressor first cut distance R9, third fin second transverse stressor first cut distance R10, third fin first transverse stressor second cut distance R11, and third fin second transverse stressor second cut distance R12 will be referenced collectively as "respective distances of the stressor partial cuts 210/212." In an aspect, the respective distances of the stressor partial cuts 210/212 can all be identical (other than processing variations). In another aspect, the respective distances of the stressor partial cuts 210/212 can be, for example, according to a set of values or nominal values.

Referring to FIGS. 1F and 2A, it will be understood that the respective distances of the stressor partial cuts 210/212 can be set to obtain a magnitude of transversal stress within N-fin channel regions (not labeled in FIG. 2A, but corresponding in position to the FIG. 1A-1F channel regions 102C) that is greater, by a second difference, than the magnitude of transversal stress (not explicitly labeled in FIG. 1F) within the N-fin first distal region and second distal region. In an aspect, increasing the second difference can increase the longitudinal tensile strain in the fin channel regions, and decreasing the second difference can decrease the longitudinal tensile strain. It will be understood the second difference can be adjusted, for example, by adjusting the width D2 and/or by adjusting the respective positioning of the first transverse stressor partial cuts 210, and the second transverse stressor partial cuts 212, and hence, the respective distances of the stressor partial cuts 210/212.

The PCG stressed fin NMOS FinFET device 200 was described having three fins 202. Configurations are contemplated having, for example, one fin. In one example one fin configuration (not explicitly visible in the figures) the gate-stressor member can be configured to have a fin gate surface, which can be configured to straddle and engage the fin channel region of the fin, and to cause a transverse stress, for example, as described for the three fin example PCG stressed fin NMOS FinFET device 200. In addition, in one example one fin configuration, the first transverse stressor element may be configured to have just one partial cut, which can be termed a "first transverse stressor partial cut" and the second transverse stressor element may be configured to have just one partial cut, which can be termed a "second transverse stressor partial cut." The first transverse stressor partial cut can be configured to form a first transverse stressor partial cut edge adjacent to the fin, and spaced from the fin by a first transverse stressor cut distance. Likewise, the second transverse stressor partial cut can be configured to form a second transverse stressor partial cut edge adjacent to the fin, and spaced from the fin by a second transverse stressor cut distance.

In another example one fin configuration having aspects of the PCG stressed fin NMOS FinFET device 200, the first transverse stressor element partial cut can be a first transverse stressor element first partial cut, and the first transverse stressor element can be further configured to have a first transverse stressor element second partial cut. Similarly, the second transverse stressor element partial cut can be a second transverse stressor element first partial cut, and the second transverse stressor element can be further configured to have a second transverse stressor element second partial cut. Also, in one such example, the first transverse stressor cut distance can be a first transverse stressor first cut distance, and the first transverse stressor element second partial cut can be configured to form a partial cut edge adjacent to the fin and spaced from the fin by a first transverse stressor second cut distance. In like manner, the second transverse stressor cut distance can be a second transverse stressor first cut distance, and the second transverse stressor element second partial cut can be configured to form a partial cut edge adjacent to the fin and spaced from the fin by a second transverse stressor second cut distance.

Figure 3:
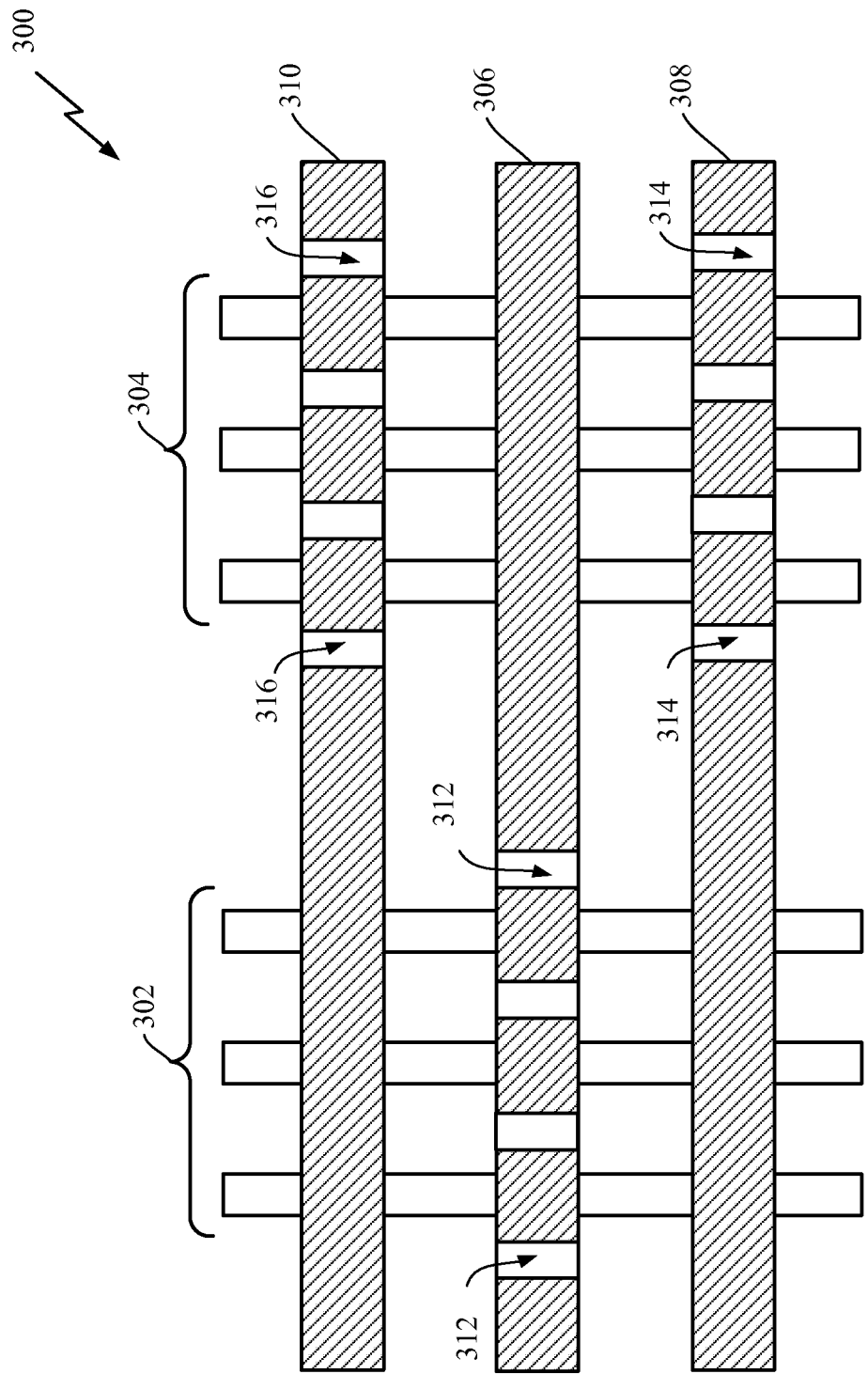
FIG. 3 is a top projection view of one example PCG stressed fin NMOS/PMOS FinFET according to one or more aspects.

FIG. 3 is a top projection view of one example PCG stressed fin NMOS/PMOS FinFET device 300 according to one or more aspects. The PCG stressed fin NMOS/PMOS FinFET device 300 can be one example combination having structure according to the PCG stressed fin PMOS FinFET device 100 and structure according to the PCG stressed fin NMOS FinFET device 200. Referring to FIG. 3, the PCG stressed fin NMOS/PMOS FinFET device 300 can include a set of PMOS FinFET device fins 302 (hereinafter "P-fins 302") and a set of NMOS FinFET device fins 304 (hereinafter "N-fins 304"). In an aspect, the PCG stressed fin NMOS/PMOS FinFET device 300 can include a shared gate-stressor member 306, a shared first transverse stressor member 308 and a shared second transverse stressor member 310. The shared gate-stressor member 306 can be formed of metal. The shared gate-stressor member 306 can be configured to form a set of fin gate surfaces (not explicitly visible in FIG. 3), which can include a fin gate surface for, and that straddles, each of the P-fins 302, in the respective channel region (not explicitly visible in FIG. 3) of each of the P-fins 302, and a fin gate surface for, and that straddles each of the N-fins 304, in the respective channel region (not explicitly visible in FIG. 3) of each of the N-fins 304. The shared first transverse stressor member 308 and the shared second transverse stressor member 310 can each be formed of metal, in an aspect, the same metal as the shared gate-stressor member 306. The shared second transverse stressor member 310 can be configured to straddle and engage each of the P-fins 302 and each of the N-fins 304, for example, at a first distal region (visible in FIG. 3 but not separately labeled). The shared second transverse stressor member 310 can likewise be configured to straddle and engage each of the P-fins 302 and each of the N-fins 304, for example at a second distal region (visible in FIG. 3 but not separately labeled).

Continuing to refer to FIG. 3, the PCG stressed fin NMOS/PMOS FinFET device 300, the shared gate-stressor member 306 can be formed with a PMOS configured region (visible in FIG. 3 but not separately labeled) that extends over the P-fins 302, and with an NMOS configured region (visible in FIG. 3 but not separately labeled) that extends over the N-fins 304. The PMOS-configured region of the shared gate-stressor member 306 can be configured to have a plurality of partial cuts, generically labeled "312," which can be configured, for example, as the partial cuts 110 described in reference to FIGS. 1A-1F. Similarly, the shared first transverse stressor member 308 and the shared second transverse stressor member 310 can each be formed with a PMOS configured region (visible in FIG. 3 but not separately labeled) that extends over the P-fins 302, and an NMOS configured region (visible in FIG. 3 but not separately labeled) that extends N-fins 304. The PMOS-configured region of the shared first transverse stressor member 308 and the PMOS-configured region of the shared second transverse stressor member 310 can include respective pluralities of partial cuts, such as the examples generically labeled "314" and "316." The examples generically labeled 314 and the examples generically 316 can be configured, for example, as the plurality of first transverse stressor partial cuts 210 and the plurality of second transverse stressor partial cuts 212, respectively, described in reference to FIGS. 2A-2B.

Referring to FIG. 3, features provided by devices such as the PCG stressed fin NMOS/PMOS FinFET device 300 can include a fabrication that can form a set of common in-process members (not explicitly visible in FIG. 3) corresponding to the shared gate-stressor member 306, and to the shared first transverse stressor member 308 and the shared second transverse stressor member 310, which can extend, for example, with a uniform configuration, over both NMOS fin sets and PMOS fin sets. In a further feature, a fabrication can selectively form partial cuts in different regions, for example by adapting conventional masking and etching operations. The masking and etching can be performed to provide partial cuts that can both obtain the NMOS-specific (tensile) and PMOS specific (compressive) channel strain and, in addition, can provide device-specific tuning of the magnitudes of the channel strains.

FIGS. 4A-10B shows, by snapshot sequence, exemplary operations according to various aspects, in one process of fabricating example sets of multiple cut gate stressed channel FinFET devices. The exemplary operations can include adaptations of certain conventional FinFET processing techniques. To avoid obfuscation, detailed description of such techniques is omitted, except where such details may be incidental to described operations.

FIG. 4A shows a top projection view of one in-process structure 400 including one example set of P-channel fins 402 and one example neighboring set of N-channel fins 404, according to one or more aspects. FIG. 4B is a cut-away front projection view of the FIG. 4A in-process structure 400, from the FIG. 4A front projection cutting plane 7-7. The P-channel fins 402 may, for example, be structured the same as the fins 102 of the PCG stressed fin PMOS FinFET device 100. The N-channel fins 404 may, for example, be structured the same as the fins 202 of the PCG stressed fin NMOS FinFET device 200. In an example implementation, the P-channel fins 402 and the N-channel fins 404 may be designed and fabricated applying conventional FinFET design and fabrication techniques. For example, processing may include conventional fin patterning and etching, oxide fill, chemical mechanical planarization (CMP), and forming of recesses 406, not necessarily specific to disclosed aspects and, therefore, further detailed description is omitted FIG. 5A shows a top projection view of one subsequent in-process structure 500 including the FIG. 4A-4B in-process structure, after formation of one example set of parallel in-process gates 502. The in-process gates 502 can be metal. FIG. 5B is a cut-away front projection view of the FIG. 5A subsequent in-process structure 500, from the FIG. 5A front cutting plane 8-8.

Referring to FIGS. 5A-5B, it will be understood that only the middle in-process "gate" 502-2 will eventually be an actual electrical gate. The in-process gate 502-1 and the in-process gate 502-3 will be processed to form transverse stressors such as the examples described in association with the PCG stressed fin PMOS FinFET device 100 and the PCG stressed fin NMOS FinFET device 200. In an aspect, the in-process gates 502 can be fabricated by adapting conventional FinFET gate fabrication techniques. Conventional techniques that may be adapted can include, for example, conventional polysilicon (Poly Si) deposition; gate patterning and etching; inter-layer dielectric (ILD) deposition and planarization; followed by adaptation of conventional technique replacement metal gate process; Poly Si removal, high-K oxide deposition, metal gate deposition, and CMP. Referring to FIG. 5B, the conventional technique high-K oxide deposition can form the high-K dielectric 506. The adaptation can be straightforward, namely, form three "gates," extending in parallel and spaced apart as described above, instead of the conventional one gate.

FIG. 6A shows a top projection view of next subsequent in-process structure 600, including the FIG. 5A-5B in-process structure 500, after formation of masks 602 for one example cut pattern for one set of PCG stressed channel NMOS FinFETs and of masks 604 for one example cut pattern for one set of PCG stressed channel PMOS FinFET. FIG. 6B is a cut-away front projection view of the FIG. 6A next subsequent in-process structure 600, from the FIG. 6A front projection cutting plane 9-9. The masks 602, for example, may be resist openings configured to form the partial cuts 110 of the PCG stressed fin PMOS FinFET device 100 described above. One example of resist openings is labeled "602-1" and is visible in both FIGS. 6A and 6B. Referring to FIG. 6B, the resist is shown as 606. The masks 604, for example, may be configured to form the partial cuts 210 of the PCG stressed fin NMOS FinFET device 200 described above.

FIG. 7A shows a top projection view of one final (with respect to the illustrated portion of the fabrication) in-process structure 700, formed by operations including partial etching using the masks 602 and 604, resist strip, ILD deposition and planarization. FIG. 7B is a cut-away front projection view of the FIG. 7A final in-process structure 700, from the FIG. 7A front projection cutting plane 10-10. Referring to FIG. 7B, the partial etching can form the fully visible partial cut labeled 702 and the partially visible partial cut, which is not labeled. The depth D2, relative to the full thickness T2, for example, can be as described for the depth D1 and thickness T of corresponding structure in the PCG stressed fin PMOS FinFET device 100. The ILD deposition can form the ILD layer 704 and fill the partial cut 702.

FIGS. 8A-10 show, by snapshot sequence, example operations in part of one alternative process for forming partial cuts according to various aspects.

Referring to FIG. 8A, this shows a top projection view of an in-process structure 800 having poly silicon dummy gates 802-1, 802-2 and 802-3, formed across P-channel fins 804 and N-channel fins 806. FIG. 8B is a cut-away front projection view of the FIG. 8A in-process structure 800, from the FIG. 8A cutting plane 11-11. Referring to FIG. 8A, an example distribution and arrangement of partial gate cuts is shown formed in the segment (visible but not separately labeled) of the poly silicon dummy gate 802-2 that spans the dummy P-channel fins 804. A representative one of these partial cuts is labeled "808." Referring to FIG. 8B, the partial cut 808 can have a depth (visible but not separately labeled) corresponding, for example, to the depth D1 of the partial cuts 110 formed in the gate-stressor member 104 of the PCG stressed fin PMOS FinFET device 100. Referring to FIG. 8A, an example distribution and arrangement of partial gate cuts (visible in FIG. 8A, not visible in FIG. 8B) is shown formed in the respective, parallel segments (visible but not separately labeled) of the poly silicon dummy gates 802-1 and 802-3 that 802-2 that span the N-channel fins 806. A representative one of these partial cuts is labeled "810."

FIG. 9 shows a next in-process structure 900, from the FIG. 8A cutting plane, formed by ILD deposition and planarization to fill the FIG. 8A-8B partial cuts 808 and 810. Referring to FIG. 9, the portion of the poly silicon dummy gate 802-2 that is visible is formed of polysilicon.

FIG. 10 shows a next in-process structure, from the FIG. 8A cutting plane, formed by removing FIG. 8A-9B poly silicon dummy gates and applying a replacement metal gate process. The replacement metal gate process can, for example, comprise an adaptation of conventional FinFET replacement metal gate processes. Examples of such operations can include removal of the poly silicon, deposition of a high K dielectric followed by the metal gate.

Figure 11:
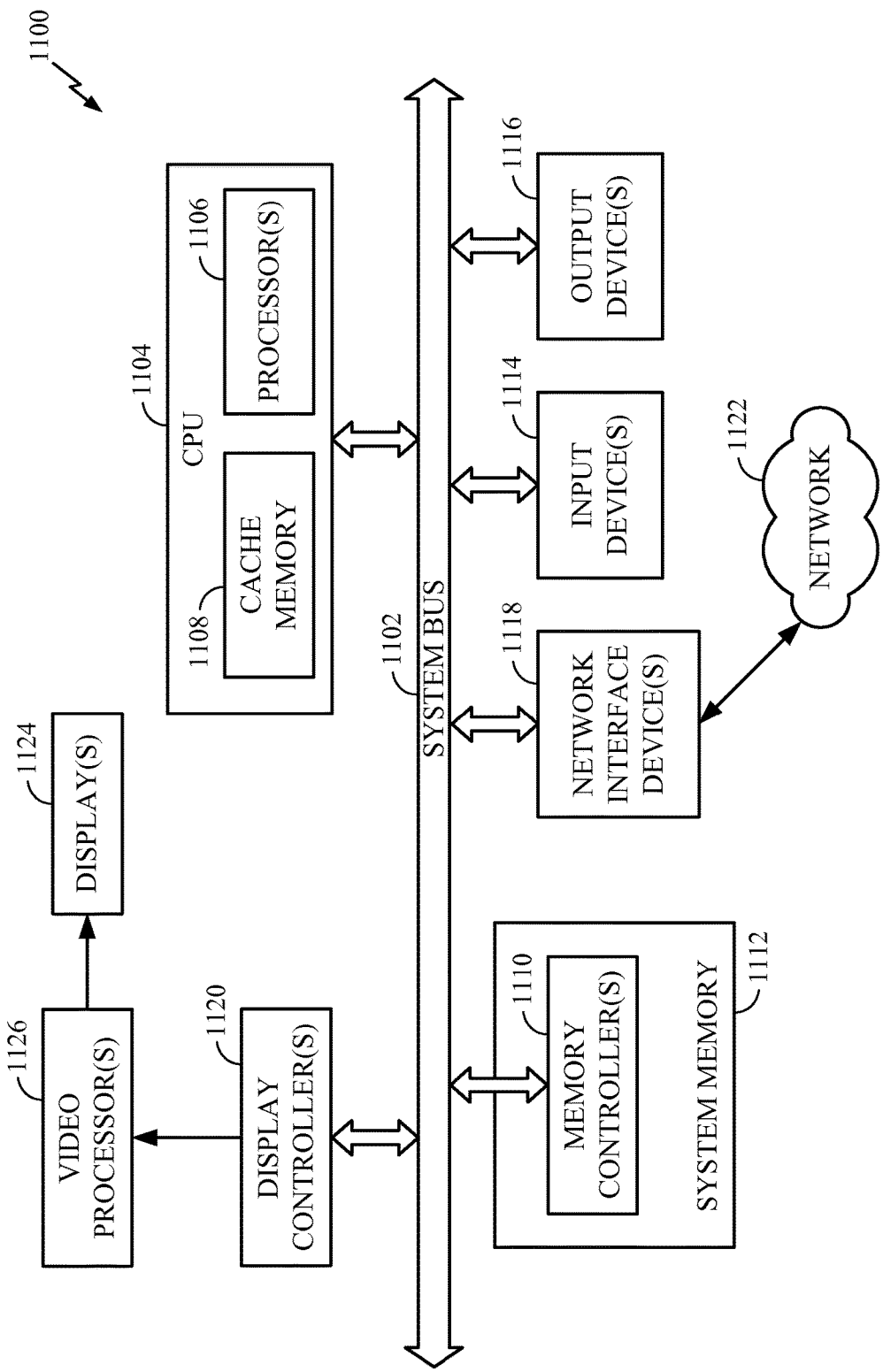
FIG. 11 shows a functional schematic of one example personal communication and computing device in accordance with one or more aspects.

FIG. 11 illustrates one example of a personal communication and computing device 1100 that can be configured, as described herein, to utilize the PCG stressed fin devices described in reference to the FIGS. 1A-10. 100. Referring to FIG. 11, the personal communication and computing device 1100 can include a system bus 1102 and, coupled to the system bus 1102, one or more CPUs 1104. The CPUs 1104 may comprise, for example, one or more processors or CPUs 1106 and one or more cache memories 1108. The CPU(s) 1106 may be implemented by, for example, one or more programmable computing devices such as, without limitation, one or more ARM-type processing devices (not separately visible in FIG. 11). The CPU(s) 1106 may capable of performing as a master device. The CPU(s) 1106 may be inter-coupled, for example through the system bus 1102, to various master and slave devices. The CPUs 1104 may, according to conventional communication protocols, communicate with these other devices by exchanging address, control, and data information over the system bus 1102. Although not illustrated in FIG. 11, multiple system buses 1102 may be provided. In examples having multiple system buses 1102, each system bus 1102 may constitute a different fabric.

Referring to FIG. 11, the CPU(s) 1104 may communicate bus transaction requests to a memory controller 1110 of a memory system 1112 as one example of a slave device.

Referring to FIG. 11, examples of other master and slave devices can include one or more input devices 1114, one or more output devices 1116, one or more network interface devices 1118, and one or more display controllers 1120. The input devices(s) 1114, if employed, can include any type of input device, including but not limited to input keys, switches, voice processors, and the like. The output device(s) 1116, if used, can include any type of output device, including but not limited to audio, video, other visual indicators and the like. The network interface device(s) 1118, if used, can be any type of network interface device configured to allow exchange of data to and from a network 1122. The network 1122 can be any type of network, including but not limited to a wired or wireless network, a private or public network, a local area network (LAN), a wide area network (WLAN) and the Internet. The network interface device(s) 1118 can be configured to support any type of communications protocol desired.

Continuing to refer to FIG. 11, the CPU(s) 1104 may also be configured to access the display controller(s) 1120 over the system bus 1102 to control information sent to one or more displays 1124. The display controller(s) 1120 may send information to the display(s) 1124 to be displayed, for example, via one or more video processors 1126. The video processors 1126 may. For example, process information to be displayed into a format suitable for the display(s) 1124. The display(s) 1124, if used, can include any type of display, for example, an active or passive liquid crystal display (LCD), a plasma display, and cathode ray tube (CRT).

The foregoing disclosed devices and functionalities may be designed and configured into computer files (e.g., RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

While the foregoing disclosure shows illustrative aspects and example implementations of the same, it should be noted that various changes and modifications could be made herein without departing from the scope of the invention as defined by the appended claims. Functions, steps and/or actions in accordance with the method claims need not be performed in any particular order. Furthermore, although elements of the invention may be described or claimed in the singular, the plural is contemplated unless limitation to the singular is explicitly stated.

What is claimed is:

1. A FinFET device, comprising:
   a fin, formed of a semiconductor, configured to extend in a fin direction, and including a channel region;
   a gate-stressor member, extending transverse to the fin direction, formed of a metal and having a gate surface, wherein the gate surface is configured to straddle and engage the fin in the channel region; and
   at least two transverse stressor members, each formed of a metal, and each configured to straddle and engage the fin at respective at least two regions outside of the channel region,
   wherein the gate-stressor member is configured to have a first partial cut spaced a cut distance from the fin and a second partial cut spaced the cut distance from the fin, wherein the gate-stressor member is further configured to cause through the gate surface a transverse stress in the fin, having a magnitude,
   wherein the at least two transverse stressor members are configured to cause, at the respective at least two regions outside of the channel region, at least two additional transverse stresses in the fin,
   wherein the magnitude is based at least in part on the cut distance, and wherein a combination of the magnitude and the at least two additional transverse stresses in the fin induces a longitudinal compressive strain in the channel region.

2. The FinFET device of claim 1, wherein the fin is from a set of fins, wherein the set of fins are parallel and adjacent to one another, and each fin in the set of fins includes a fin channel region,
   wherein the gate-stressor member is configured to have, for each fin in the set of fins, a fin gate surface, wherein the fin gate surface is configured to straddle and engage the fin channel region, and to cause a fin channel region transverse stress in the fin channel region, the fin channel region transverse stress having a fin channel region transverse stress magnitude,
   wherein the at least two transverse stressor members are each configured to straddle and engage each fin in the set of fins, at respective at least two regions outside of the fin channel region, and to cause additional transverse stresses in the fin, at the respective at least two regions outside of the fin channel region,
   and
   wherein, for each fin in the set of fins, a combination of the fin channel region transverse stress magnitude and the additional transverse stresses induces a longitudinal compressive strain in the fin channel region.

3. The FinFET device of claim 1, wherein the fin is a first fin, and wherein the FinFET device-further comprises: a second fin, formed of a semiconductor, including a second fin channel region, and configured to extend parallel to the fin direction, and adjacent to the first fin.

4. The FinFET device of claim 1, wherein the fin is a first fin, wherein the first fin includes a fin first distal region and a fin second distal region, spaced apart along the fin direction, wherein the channel region is between the fin first distal region and the fin second distal region, and wherein the at least two transverse stressor members include:
- a first transverse stressor member, formed of the metal, extending parallel to the gate-stressor member, and forming a first distal engagement surface, wherein the first distal engagement surface is configured to straddle and engage the fin in the fin first distal region, and
- a second transverse stressor member, formed of the metal, extending parallel to the gate-stressor member, and configured to form a second distal engagement surface, wherein the second distal engagement surface is configured to straddle and engage the fin in the fin second distal region.

5. The FinFET device of claim 4, wherein the magnitude is a fin channel region transverse stress magnitude,
- wherein the first transverse stressor member is configured to cause in the fin first distal region, through the first distal engagement surface, a first distal transverse stress, wherein the first distal transverse stress has a first distal transverse stress magnitude,
- wherein the second transverse stressor member is configured to cause in the fin second distal region, through the second distal engagement surface, a second distal transverse stress, wherein the second distal transverse stress has a second distal transverse stress magnitude, and
- wherein the cut distance, the first transverse stressor member and the second transverse stressor member are respectively configured to establish a relation among the fin channel region transverse stress magnitude, the first distal transverse stress magnitude and the second distal transverse stress magnitude, that induces, at least in part, the longitudinal compressive strain in the channel region.

6. The FinFET device of claim 5, wherein the channel region is a first fin channel region, the first distal transverse stress is a first fin first distal transverse stress, the second distal transverse stress is a first fin second distal transverse stress, the first distal transverse stress magnitude is a first fin first distal transverse stress magnitude, the second distal transverse stress magnitude is a first fin second distal transverse stress magnitude, the fin first distal region is a first fin first distal region, and the fin second distal region is a first fin second distal region, and the fin channel region transverse stress magnitude is a first fin channel region transverse stress magnitude, and wherein the FinFET device further comprises:
- a second fin, formed of a semiconductor, including a second fin first distal region, a second fin second distal region, and a second fin channel region, and is configured to extend parallel to the fin direction, and adjacent to the first fin,
- wherein the gate-stressor member is further configured to form a second fin gate surface, wherein the second fin gate surface is configured to straddle and engage the second fin in the second fin channel region,
- wherein the first transverse stressor member is further configured to form a second fin first distal engagement surface, wherein the second fin first distal engagement surface is configured to straddle and engage the second fin in the second fin first distal region, and
- wherein the second transverse stressor member is further configured to form a second fin second distal engagement surface, wherein the second fin second distal engagement surface is configured to straddle and engage the second fin in the second fin second distal region.

7. The FinFET device of claim 6,
- wherein the gate-stressor member is further configured to cause in the second fin channel region, through the second fin gate surface, a second fin channel region transverse stress, wherein the second fin channel region transverse stress has a second fin channel region transverse stress magnitude, wherein the second fin channel region transverse stress magnitude is based, at least in part, on the cut distance.

8. The FinFET device of claim 7, wherein the FinFET device further comprises:
- a third fin, formed of a semiconductor, including a third fin channel region, a third fin first distal region, a third fin second distal region, and configured to extend parallel to the fin direction, and adjacent to the second fin,
- wherein the gate-stressor member further includes a third fin gate surface, wherein the third fin gate surface is configured to straddle and engage the third fin in the third fin channel region,
- wherein the first transverse stressor member is further configured to form a third fin first distal engagement surface, wherein the third fin first distal engagement surface is configured to straddle and engage the third fin in the third fin first distal region, and
- wherein the second transverse stressor member is further configured to form a third fin second distal engagement surface, wherein the third fin second distal engagement surface is configured to straddle and engage the third fin in the third fin second distal region.

9. The FinFET device of claim 8, wherein the first transverse stressor member is further configured to cause in the second fin first distal region, through the second fin first distal engagement surface, a second fin first distal transverse stress, wherein the second fin first distal transverse stress has a second fin first distal transverse stress magnitude,
- wherein the first transverse stressor member is further configured to cause in the third fin first distal region, through the third fin first distal engagement surface, a third fin first distal transverse stress, wherein the third fin first distal transverse stress has a third fin first distal transverse stress magnitude,
- wherein the second transverse stressor member is further configured to cause in the second fin second distal region, through the second fin second distal engagement surface, a second fin second distal transverse stress, wherein the second fin second distal transverse stress has a second fin second distal transverse stress magnitude, and
- wherein the second transverse stressor member is configured to cause in the third fin second distal region, through the third fin second distal engagement surface, a third fin second distal transverse stress, wherein the third fin second distal transverse stress has a third fin second distal transverse stress magnitude.

10. The FinFET device of claim 9,
- wherein the gate-stressor member is further configured to cause through the third fin gate surface a third fin channel region transverse stress in the third fin, having a third fin channel region transverse stress magnitude.

11. The FinFET device of claim 10,
wherein the second fin channel region transverse stress magnitude, the second fin first distal transverse stress magnitude and the second fin second distal transverse stress magnitude have a relation, wherein the relation induces, at least in part, a longitudinal compressive strain in the second fin channel region, and
wherein the third fin channel region transverse stress magnitude, the third fin first distal transverse stress magnitude and the third fin second distal transverse stress magnitude have a relation, wherein the relation induces, at least in part, a longitudinal compressive strain in the third fin channel region.

12. A FinFET device, comprising:
a fin, formed of a semiconductor, configured to extend in a fin direction, and including a channel region;
a gate-stressor member, extending transverse to the fin direction, formed of a metal and having a gate surface, wherein the gate surface is configured to straddle and engage the fin in the channel region; and
at least two transverse stressor members, formed of a metal, and configured to straddle and engage the fin at respective regions outside of the channel region,
wherein the gate-stressor member is configured to cause, through the gate surface, a transverse stress in the channel region, having a channel region transverse stress magnitude,
wherein each of the at least two transverse stressor members are configured to include a first partial cut spaced a cut distance from the fin and a second partial cut spaced the cut distance from the fin,
wherein the at least two transverse stressor members are further configured to cause, at the respective regions outside of the channel region, respective additional transverse stresses in the fin, having respective magnitudes, wherein the respective magnitudes are based at least in part on the cut distance, and
wherein the cut distance is set wherein a combination of the channel region transverse stress magnitude and the respective magnitudes induces a longitudinal tensile strain in the channel region.

13. The FinFET device of claim 12, wherein the fin is from a set of fins, wherein the set of fins are parallel and adjacent to one another, and each fin of the set of fins includes a fin channel region,
wherein the gate-stressor member further includes a fin gate surface configured to straddle and engage the fin channel region of each fin of the set of fins, and is further configured to cause in each fin of the set of fins, through the fin gate surface, a fin channel region transverse stress, wherein the fin channel region transverse stress has a fin channel region transverse stress magnitude,
wherein the at least two transverse stressor members are further configured to straddle and engage each fin of the set of fins at respective regions outside of the fin channel region,
wherein the at least two transverse stressor members are further configured to cause additional transverse stresses in each fin of the set of fins, at the respective regions outside of the fin channel region of each fin of the set of fins, wherein the additional transverse stresses have respective magnitudes, wherein the respective magnitudes are based, at least in part, on the cut distance, and wherein, in each fin of the set of fins, the cut distance is set wherein a combination of the fin channel region transverse stress magnitude and the respective magnitudes induces a longitudinal tensile strain in the fin channel region.

14. The FinFET device of claim 12, wherein the fin is a first fin, the fin channel region is a first fin channel region, and the gate surface is a first fin gate surface, wherein the FinFET device further comprises:
a second fin, formed of a semiconductor and including a second fin channel region, and configured to extend adjacent and parallel to the first fin; and
a third fin, formed of a semiconductor and including a third fin channel region, and configured to extend adjacent and parallel to the second fin,
wherein the gate-stressor member further includes a second fin gate surface and a third fin gate surface, wherein the second fin gate surface is configured to straddle and engage the second fin in the second fin channel region, and the third fin gate surface is configured to straddle and engage the third fin in the third fin channel region, and
wherein each of the at least two transverse stressor members is further configured to straddle and engage the second fin at a respective region outside of the second fin channel region and to straddle and engage the third fin at a respective region outside of the third fin channel region.

15. The FinFET device of claim 14, wherein the gate-stressor member is further configured to cause, through the second fin gate surface, a second fin channel region transverse stress, wherein the second fin channel region transverse stress has a second fin channel region transverse stress magnitude, and to cause, through the third fin gate surface, a third fin channel region transverse stress, wherein the third fin channel region transverse stress has a third fin channel region transverse stress magnitude,
wherein the at least two transverse stressor members are further configured to cause, at respective magnitudes, additional transverse stresses in the second fin, in the respective region outside of the second fin channel region, and additional transverse stresses in the third fin, in the respective region outside of the third fin channel region,
wherein a respective magnitude of the additional transverse stresses in the second fin and the second fin channel region transverse stress magnitude have a relation that induces a longitudinal tensile strain in the second fin channel region, and
wherein a respective magnitude of the additional transverse stresses in the third fin and the third fin channel region transverse stress magnitude have a relation that induces a longitudinal tensile strain in the third fin channel region.

16. The FinFET device of claim 12, wherein the fin includes a fin first distal region and a fin second distal region, spaced apart along the fin direction, wherein the channel region is between the fin first distal region and the fin second distal region, wherein the at least two transverse stressor members include a first transverse stressor member and a second transverse stressor member,
wherein the first transverse stressor member is further configured to form a first distal engagement surface, wherein the first distal engagement surface is configured to straddle and engage the fin in the fin first distal region, and wherein the second transverse stressor member is further configured to form a second distal engagement surface, wherein the second distal engagement surface is configured to straddle and engage the fin in the fin second distal region.

17. The FinFET device of claim 16, wherein the first transverse stressor member is further configured to cause, through the first distal engagement surface, a first distal transverse stress in the fin, wherein the first distal transverse stress has a first distal transverse stress magnitude, wherein the first distal transverse stress magnitude is based, at least in part, on the cut distance, and wherein the second transverse stressor member is further configured to cause, through the second distal engagement surface, a second distal transverse stress in the fin, wherein the second distal transverse stress has a second distal transverse stress magnitude, wherein the second distal transverse stress magnitude is based, at least in part, on the cut distance.

18. The FinFET device of claim 17, wherein the cut distance and the gate-stressor member are respectively configured to establish a relation, wherein the relation is among the channel region transverse stress magnitude, the first distal transverse stress magnitude and the second distal transverse stress magnitude, and wherein the relation is configured to induce, at least in part, the longitudinal tensile strain in the channel region.

19. The FinFET device of claim 12, wherein the fin is a first fin, and wherein the FinFET device further comprises: a second fin, formed of a semiconductor, configured to extend adjacent and parallel to the first fin, including a second fin channel region; and a third fin, formed of a semiconductor, configured to extend adjacent and parallel to the second fin, including a third fin channel region.

* * * * *